United States Patent
Nguyen et al.

(10) Patent No.: US 7,899,237 B2
(45) Date of Patent: Mar. 1, 2011

(54) METHOD, APPARATUS AND SYSTEM FOR DETECTING ANOMALIES IN MIXED SIGNAL DEVICES

(75) Inventors: Dat T. Nguyen, Dallas, TX (US); Thao To, Dallas, TX (US); David Maxwell, Dallas, TX (US); Naweed Anjum, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 970 days.

(21) Appl. No.: 11/683,548

(22) Filed: Mar. 8, 2007

(65) Prior Publication Data

US 2008/0219546 A1     Sep. 11, 2008

(51) Int. Cl.
*G06K 9/00*     (2006.01)

(52) U.S. Cl. ................ 382/141; 382/140; 382/144; 382/145; 382/147; 382/149; 382/151

(58) Field of Classification Search ............... 382/141, 382/140, 144, 145, 147, 149, 151
See application file for complete search history.

(56) References Cited

U.S. PATENT DOCUMENTS

| | | | |
|---|---|---|---|
| 5,430,305 A * | 7/1995 | Cole et al. | 250/559.07 |
| 7,038,474 B2 * | 5/2006 | McGinnis et al. | 324/752 |
| 7,184,906 B2 * | 2/2007 | Fender et al. | 702/67 |

* cited by examiner

*Primary Examiner*—Matt Bella
*Assistant Examiner*—Mike Rahmjoo
(74) *Attorney, Agent, or Firm*—Warren L. Franz; Wade J. Brady; Frederick J. Telecky, Jr.

(57) ABSTRACT

An embodiment relates generally to a method of testing a mixed signal device. The method includes monitoring multiple parameters of the mixed signal device and scanning the mixed signal device with an optical source. The method also includes forming multiple windows, where each window is assigned to a respective parameter. The method further includes comparing an image from a respective image to a reference image to determine an existence of an anomaly.

13 Claims, 2 Drawing Sheets

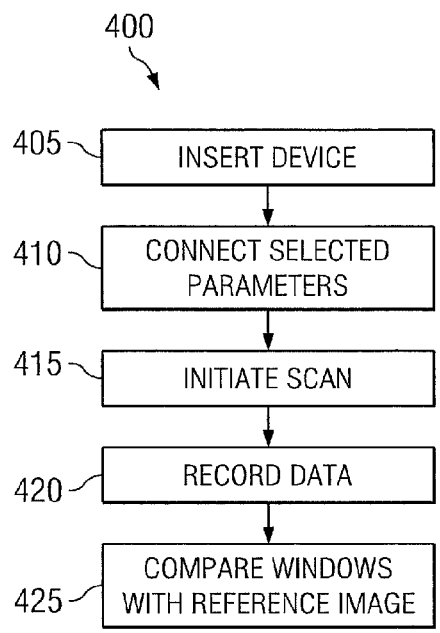
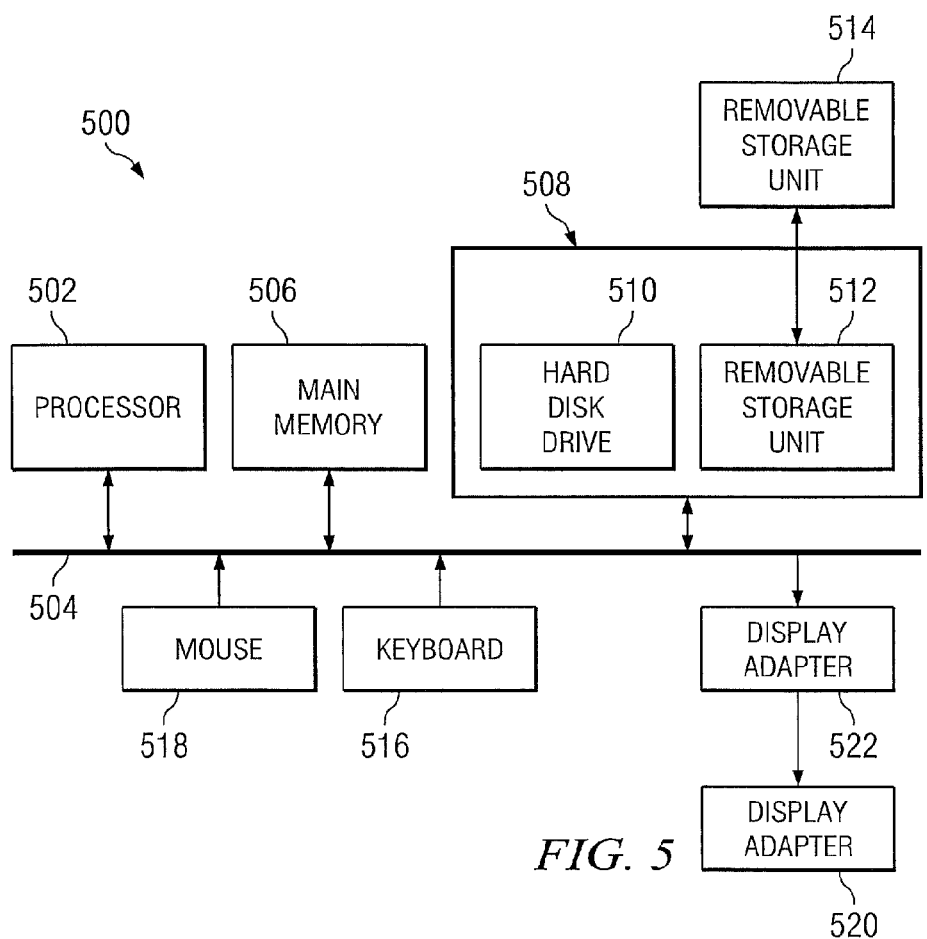

METHOD, APPARATUS AND SYSTEM FOR DETECTING ANOMALIES IN MIXED SIGNAL DEVICES

FIELD

This invention relates generally to detecting anomalies, more particularly, to a method, apparatus and system for detecting anomalies in mixed signal devices.

DESCRIPTION OF THE RELATED ART

The semiconductor industry has recently experienced technological advances that have permitted dramatic increases in integrated circuit ("IC") density and complexity, and equally dramatic decreases in power consumption and package sizes. Present semiconductor technology now permits single-die microprocessors with many millions of transistors, operating at speeds of hundreds of millions of instructions per second to be packaged in relatively small and air-cooled semiconductor device packages.

As the manufacturing processes for semiconductor devices and integrated circuits increase in difficulty, methods for testing and debugging these devices become increasingly important. Not only is it important to ensure that an individual die is functional, it is also important to ensure that batches of dice perform consistently. In addition, the ability to detect a defective manufacturing process early is helpful for reducing the number of defective devices manufactured.

When an IC device is found defective during a quality control test, various failure analysis techniques can be used to determine the cause of such failure. Two of the more recently developed techniques for performing failure analysis are the infrared light emission microscopy and the light-induced voltage alteration (LIVA) imaging technique. In the infrared light emission light analysis, an infrared light transmitted through a substrate silicon material is used to observe from the backside of an IC the failure mode of the circuit. For instance, at a magnification ratio of 100×, a failure point in the circuitry can be located. The LIVA imaging technique can be used to locate open-circuited and damaged junctions and to image transistor logic states. The LIVA images are produced by monitoring the voltage fluctuation of a constant current power supply when a laser beam is scanned over an IC. A high selectivity for locating defects is possible with the LIVA technique.

Another method that has become more common in failure analysis of IC chips is the scanning optical microscopy (SOM). The high focusing capability of SOM provides improved image resolution and depth comparable to conventional optical microscopy. It is a useful tool based on the laser beam's interaction with the IC. The SOM technique enables the localization of photocurrents to produce an optical beam induced current image that show junction regions and transistor logic states. Several major benefits are made possible by the SOM method when compared to a conventional scanning electron microscopy analysis. For instance, the benefits include the relative ease of making an IC electrical connection, the lack of a required vacuum system and the absence of ionizing radiation effects.

Currently, comprehensive and low-cost test methodologies for analog and mixed-signal systems analogous do not exist. Test methodologies for mixed-signal systems are based primarily on the paradigm of measuring the circuit's specifications to determine if they are "good" or "bad". This method is known as specification based testing. With this method of testing, each specification is measured for each circuit, e.g., an integrated circuit (IC), to ensure that the circuit satisfies all specified parameters.

Specification based testing has many drawbacks. Foremost perhaps is the cost associated with such testing. Testing costs include both the cost of test development as well as the costs associated with conducting the actual manufacturing tests. The cost factor becomes critical in high volume production of analog and mixed-signal ICs. Most of the previous research in test generation for fault detection in analog circuits assumes that a list of faults for which tests are to be generated is given. This approach is known as fault based testing. Realistic fault lists can be generated from analysis of the circuit layout using inductive fault analysis (IFA) based techniques.

SUMMARY

An embodiment relates generally to a method of testing a mixed signal device. The method includes monitoring multiple parameters of the mixed signal device and scanning the mixed signal device with an optical source. The method also includes forming multiple windows, where each window is assigned to a respective parameter. The method further includes comparing an image from a respective image to a reference image to determine an existence of an anomaly.

Another embodiment pertains generally to a mixed signal tester apparatus. The apparatus includes a mixed signal device, an optical source configured to generate light to scan the mixed signal device in a pattern, and multiple sensors. Each sensor is configured to monitor a respective parameter of the mixed signal device. The apparatus also includes a controller configured to interface with the optical source and the multiple sensors. The controller is also configured to monitor the multiple sensors substantially simultaneously as the optical source scans the mixed signal device and to record the associated values from the multiple sensors. The controller can also be configured to form images based on the associated values and to display anomalies based on a comparison of a respective image with a reference image.

Yet another embodiment relates generally to a system for detecting anomalies. The system includes a device interface configured to interface with a mixed signal device and an optical source configured to generate light to scan the mixed signal device in a pattern. The system also includes multiple sensors, where each sensor is configured to monitor a respective parameter of the mixed signal device, and a controller configured to interface with the optical source and the multiple sensors. The controller is also configured to monitor the multiple sensors substantially simultaneously as the optical source scans the mixed signal device and to record the associated values from the multiple sensors. The controller is further configured to form images based on the associated values and to display anomalies based on a comparison of a respective image with a reference image.

BRIEF DESCRIPTION OF THE DRAWINGS

Various features of the embodiments can be more fully appreciated, as the same become better understood with reference to the following detailed description of the embodiments when considered in connection with the accompanying figures, in which:

FIG. 4 depicts an exemplary flow diagram executed by the system in accordance with yet another embodiment;

FIG. 5 illustrates an exemplary computing platform in accordance with yet another embodiment.

DETAILED DESCRIPTION OF EMBODIMENTS

For simplicity and illustrative purposes, the principles of the present invention are described by referring mainly to exemplary embodiments thereof. However, one of ordinary skill in the art would readily recognize that the same principles are equally applicable to, and can be implemented in, all types of testing systems, and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Embodiments relate generally to systems and methods for testing mixed signal devices. More particularly, an optical mixed signal tester can be configured to test mixed signal devices. Mixed signal devices are typically equipped with multiple power supplies. The optical mixed signal tester can be configured to scan a device-under-test (DUT, i.e., a mixed signal device) with an optical source such as a scanning optical microscopy ("SOM"). Substantially simultaneously, the optical mixed signal tester can also be configured to monitor various parameters such as input/output ("I/O"), power supplies, etc., while the DUT is being scanned. The monitored parameters can be amplified and plotted along with the location of light from a laser from the SOM on the DUT. After each scan, each monitored parameter has an associated window where the plot of the response is displayed. The image in the window is compared to a reference image of the DUT. A discrepancy in an overlay between the image of the window and the window of a previously scanned known good unit image indicates a localization of any anomalies.

Figure 1:
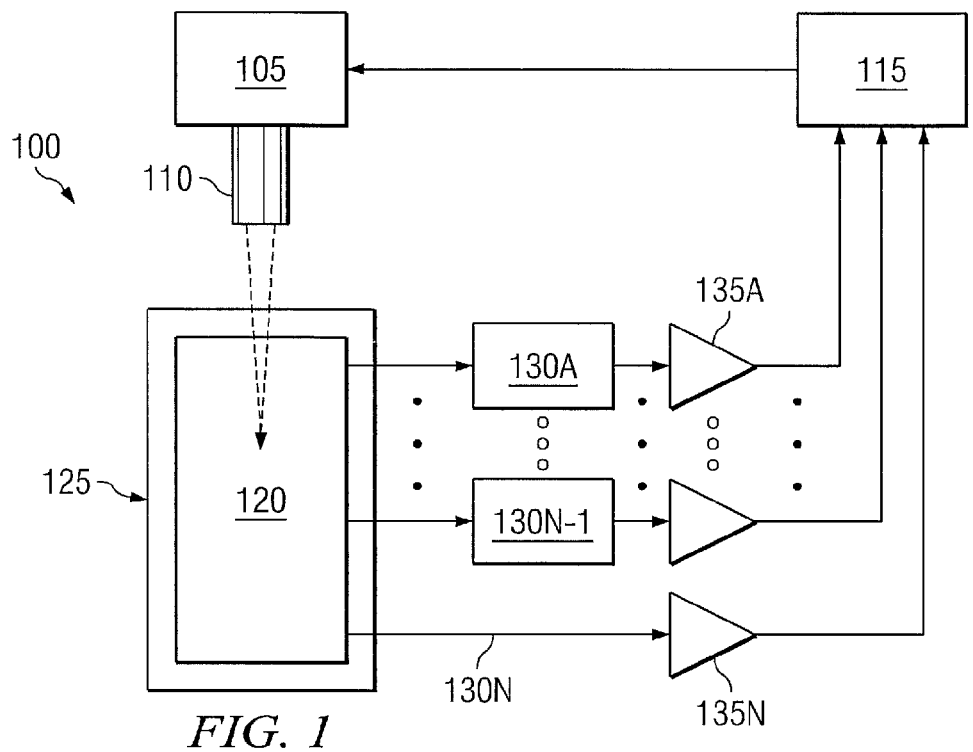
FIG. 1 depicts an exemplary system in accordance with an embodiment.

FIG. 1 depicts an exemplary system 100, an optical mixed signal tester, in accordance with an embodiment. It should be readily apparent to those of ordinary skill in the art that the system 100 depicted in FIG. 1 represents a generalized schematic illustration and that other components can be added or existing components can be removed or modified.

As shown in FIG. 1, the system 100 includes an optical microscope 105 with a laser 110 as an optical source. The optical microscope 105 can be configured to interface with the controller 115. The controller 115 can, among other functions, be configured to control and manage the optical microscope 105 and the laser. For example, the controller 115 can direct the optical microscope 105 to scan a DUT, e.g., a mixed signal device, in a preset pattern, e.g., a raster scan or a pattern as designated by an operator of system 100.

The optical microscope 105 can be implemented as a scanning optical microscopy device as known to those skilled in the art. The laser 110 can be configured to operate at a frequency in about the range between 400 and 2000 micrometers.

In some embodiments, the light from the laser 110 can be configured to scan a device-under-test (DUT) 120. The DUT 120 can be configured to interface with the test interface 125. The DUT 120 can be any type of integrated circuit ("IC"). In other embodiments, the DUT 120 can be implemented as a mixed signal device, i.e., an IC with analog components as well as digital components.

The test interface 125 can be configured to accept the IC form package of a selected DUT. The test interface 125 can also be configured to facilitate the testing of a selected DUT. More particularly, the test interface 125 can include sensors 130A-N. The sensors 130A-N can be configured as a lead connected to a pin of the test interface with a respective filter/amplifier 135 and/or the sensors 130A-N can be connected to a node on a selected DUT.

The filter/amplifier 135A-N can be configured to amplify any received signals from the DUT 120 as the laser 110 scans the DUT 120. The amplified signals are recorded along with the location of the light from the laser 110 on the DUT 120 by the controller 115.

The controller 115 can be configured to process the data from the sensors 130. More particularly, the controller can store the parameter data along with a location of the laser 110 in a data structure associated with a selected parameter. The data structure can be a list, a linked list, a table, a database or other data structure that correlates data with a location of the laser 110 at the time the parameter data is being recorded.

Figure 2:
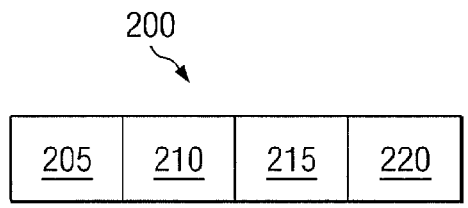
FIG. 2 depicts an exemplary data format in accordance with another embodiment.

FIG. 2 illustrates an exemplary data format for the data being recorded in the data structure. It should be readily apparent to those of ordinary skill in the art that the data format 200 depicted in FIG. 2 represents a generalized schematic illustration and that other field can be added or existing fields can be removed or modified.

As shown in FIG. 2, data format 200 includes a parameter name field 205, a value field 210, a location field 215 and a time field 220. For each parameter being monitored, the parameter name field 205 can be configured to provide a mechanism to label the parameter being monitored. The value field 210 can be configured to store the value of the monitored parameter at the location of the light from the laser 110, which is stored in the location field 215. The time field 220 can indicate the time at which the data was recorded.

Returning to FIG. 1, the controller 115 can also be configured to store a reference image of a defect free version of a selected DUT. The controller 115 can then generate an image in a window based on the stored parameter data for the selected parameter. Since there are multiple parameters, there are multiple windows that each are associated with a respective parameter.

Figure 3:
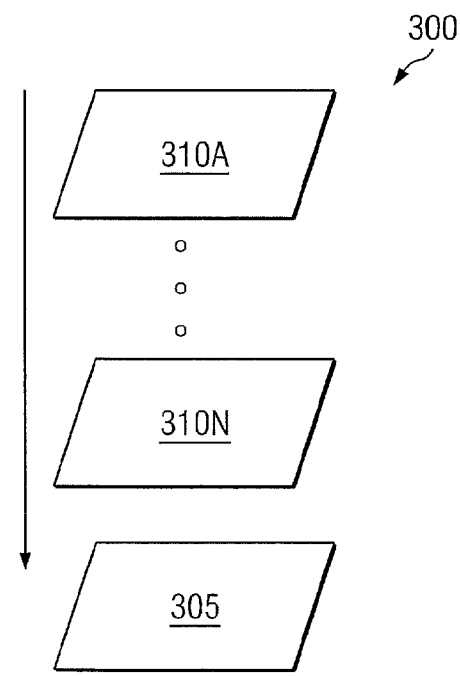
FIG. 3 illustrates a comparison of windows with a reference image.

As part of the analysis process, the controller 115 can provide a mechanism for a user to compare the captured parameter data with the reference image. More particularly, the controller 115 can provide a user interface which displays the multiple parameters being monitored. The user can select the parameters, either a single parameter, a subset of parameters or all the parameters, for the comparison with the reference image. The controller 115 can then superimpose a display (image, plot, etc.) of the selected parameters over the reference image for a user to analyze, as shown in FIG. 3. FIG. 3 depicts a reference image 305 with parameter displays 310A-310N. The controller 115 can then be configured to display a composite image of the selected parameter displays and the reference image.

FIG. 4 depicts an exemplary process flow 400 in accordance with another embodiment. It should be readily apparent to those of ordinary skill in the art that the process flow 400 depicted in FIG. 4 represents a generalized schematic illustration and that other components can be added or existing components can be removed or modified.

As shown in FIG. 4, in step 405, a user can select a mixed signal device to be inserted into the test interface 125 of the system 100. The user can then connect the appropriate sensors 130A-130N for a user defined set of parameters, for example, power supplies, input/output lines, node points on the mixed signal device, in step 410.

In step 415, the user can initiate a scan of the mixed signal device from the controller 115. More particularly, the controller 115 can execute a software program that is configured to control the optical microscope 105 and laser 110 as well as record the data from the sensors 130A-130N, in step 420. As noted previously, the data being captured includes the value of the selected parameter with a location of the light from the laser 110 at the time the selected parameter is being obtained.

In step 425, the user can initiate an analysis mode in the software being executed by the controller 115. More particularly, controller 115 can provide a user interface which displays the multiple parameters being monitored. The user can select the parameters, either a single parameter, a subset of parameters or all the parameters, for the comparison with the reference image. The controller 115 can then superimpose a display (image, plot, etc.) of the selected parameters over the reference image for a user to analyze.

FIG. 5 illustrates an exemplary block diagram of a computing platform 500 where an embodiment may be practiced. The functions of the controller 115 can be implemented in program code and executed by the computing platform 500. The software being executed by the controller 115 can be implemented with languages such as PASCAL, C, C++, JAVA, etc.

As shown in FIG. 5, the computer system 500 includes one or more processors, such as processor 502 that provide an execution platform for embodiments of the controller 115. Commands and data from the processor 502 are communicated over a communication bus 504. The computer system 500 also includes a main memory 506, such as a Random Access Memory (RAM), where the operating system can execute during runtime, and a secondary memory 508. The secondary memory 508 includes, for example, a hard disk drive 510 and/or a removable storage drive 512, representing a floppy diskette drive, a magnetic tape drive, a compact disk drive, etc., where a copy of a computer program embodiment for the controller 115 can be stored. The removable storage drive 512 reads from and/or writes to a removable storage unit 514 in a well-known manner. A user interfaces with the operating system and delay process with a keyboard 516, a mouse 518, and a display 520. A display adapter 522 interfaces with the communication bus 504 and the display 520. The display adapter also receives display data from the processor 502 and converts the display data into display commands for the display 520.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or simultaneously. Those skilled in the art will recognize that these and other variations are possible within the spirit and scope as defined in the following claims and their equivalents.

What is claimed is:

1. A mixed signal test apparatus, the apparatus comprising:
an optical source configured to generate light to scan the mixed signal device in a pattern;
multiple sensors, each sensor of the multiple sensors configured to monitor a respective parameter of the mixed signal device; and
a controller configured to interface with the optical source and the multiple sensors, to monitor the multiple sensors substantially simultaneously as the optical source scans the mixed signal device, to record the associated values from the multiple sensors, to form images based on the associated values, and to display anomalies based on a comparison of a respective image with a reference image.

2. The apparatus of claim 1, wherein the multiple sensors are configured to interface with multiple amplifiers.

3. The apparatus of claim 1, wherein the controller is further configured to associate a location of a light from the optical source on the mixed signal device with the associated values from the multiple sensors.

4. The apparatus of claim 1, wherein the controller is further configured to monitor a subset of the multiple sensors.

5. The apparatus of claim 1, wherein the optical source is a laser.

6. The apparatus of claim 1, wherein the optical source is a scanning optical microscopy.

7. The apparatus of claim 1, wherein a subset of the multiple sensors are configured to monitor multiple power supplies of a mixed signal device.

8. The apparatus of claim 1, wherein a subset of the multiple sensors are configured to monitor input/output pins of a mixed signal device.

9. A system for detecting anomalies, the system comprising:
a device interface configured to interface with a mixed signal device;
an optical source configured to generate light to scan the mixed signal device in a pattern;
multiple sensors, each sensor configured to monitor a respective parameter of the mixed signal device; and
a controller configured to interface with the optical source and the multiple sensors, to monitor the multiple sensors substantially simultaneously as the optical source scans the mixed signal device, to record the associated values from the multiple sensors; to form images based on the associated values, and to display anomalies based on a comparison of a respective image with a reference image.

10. The system of claim 9, wherein the multiple sensors are configured to interface with multiple amplifiers, each sensor of the multiple sensors configured to interface with a respective amplifier.

11. The system of claim 9, wherein the controller is further configured to associate a location of a light from the optical source on the mixed signal device with the associated values from the multiple sensors.

12. The system of claim 9, wherein the controller is further configured to monitor a subset of the multiple sensors.

13. The system of claim 9, wherein the optical source is a laser.

* * * * *